US006951982B2

(12) United States Patent
Chye et al.

(10) Patent No.: US 6,951,982 B2
(45) Date of Patent: Oct. 4, 2005

(54) PACKAGED MICROELECTRONIC COMPONENT ASSEMBLIES

(75) Inventors: Lim Thiam Chye, Singapore (SG); Setho Sing Fee, Singapore (SG); Eric Tan Swee Seng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 289 days.

(21) Appl. No.: 10/323,150

(22) Filed: Dec. 18, 2002

(65) Prior Publication Data

US 2004/0100772 A1 May 27, 2004

(30) Foreign Application Priority Data

Nov. 22, 2002 (SG) ..................................... 200207050-6

(51) Int. Cl.[7] .............................................. H01L 23/02
(52) U.S. Cl. ....................... 174/52.2; 257/686; 361/735
(58) Field of Search .............................. 174/52.5, 52.3, 174/52.4; 257/686, 723, 724, 725, 777, 778; 361/729, 730, 735

(56) References Cited

U.S. PATENT DOCUMENTS

| | | | |
|---|---|---|---|
| 4,012,579 A | 3/1977 | Fox et al. | |
| 4,862,245 A | 8/1989 | Pashby et al. | |
| 4,996,587 A | * 2/1991 | Hinrchsmeyer et al. | 357/74 |
| 5,107,328 A | 4/1992 | Kinsman | |
| 5,128,831 A | 7/1992 | Fox, III et al. | |
| 5,138,434 A | 8/1992 | Wood et al. | |
| 5,140,404 A | 8/1992 | Fogal et al. | |
| 5,252,853 A | 10/1993 | Michii | |
| 5,252,857 A | 10/1993 | Kane et al. | |
| 5,304,842 A | 4/1994 | Farnworth et al. | |
| 5,471,369 A | 11/1995 | Honda et al. | |
| 5,475,918 A | 12/1995 | Kubota et al. | |
| 5,518,957 A | 5/1996 | Kim | |
| 5,536,969 A | 7/1996 | Matsuoka | |
| 5,583,371 A | 12/1996 | Hori | |
| 5,593,927 A | 1/1997 | Farnworth et al. | |
| 5,663,593 A | 9/1997 | Mostafazadeh et al. | |
| 5,665,651 A | 9/1997 | Asada et al. | |
| 5,677,566 A | 10/1997 | King et al. | |
| 5,696,033 A | 12/1997 | Kinsman | |
| 5,715,593 A | 2/1998 | Kimura | |
| 5,729,049 A | 3/1998 | Corisis et al. | |
| 5,739,585 A | 4/1998 | Akram et al. | |
| 5,744,827 A | 4/1998 | Jeong et al. | |
| D394,844 S | 6/1998 | Farnworth | |
| 5,815,000 A | 9/1998 | Farnworth | |
| D402,638 S | 12/1998 | Farnworth | |

(Continued)

OTHER PUBLICATIONS

U.S. Appl. No. 10/651,913, filed Aug. 29, 2003, inventor Seng et al.

(Continued)

*Primary Examiner*—Dean A. Reichard
*Assistant Examiner*—Carmelo Oliva
(74) *Attorney, Agent, or Firm*—Perkins Coie LLP

(57) ABSTRACT

Various aspects of the invention provide microelectronic component assemblies, memory modules, computer systems, and methods of assembling microelectronic component assemblies. In one particular implementation, a microelectronic component assembly includes a non-leaded first package, a second package, and a plurality of electrical junctions. The first package has a confronting surface that includes an exposed back surface of a microelectronic component and exposed contact surfaces. The second package has a confronting surface that includes an exposed back surface of a microelectronic component and exposed contact surfaces of a number of leads. Each of the junctions couples one of the contacts to the contact surface of one of the leads. The electrical junctions may also physically support the packages with their respective confronting surfaces juxtaposed with but spaced from one another, defining a peripherally open fluid passage and enhancing thermal performance.

37 Claims, 7 Drawing Sheets

U.S. PATENT DOCUMENTS

| | | | |
|---|---|---|---|
| 5,847,455 | A | 12/1998 | Manteghi |
| 5,851,845 | A | 12/1998 | Wood et al. |
| 5,866,939 | A | 2/1999 | Shin et al. |
| 5,866,953 | A | 2/1999 | Akram et al. |
| 5,879,965 | A | 3/1999 | Jiang et al. |
| 5,883,426 | A | 3/1999 | Tokuno et al. |
| 5,891,753 | A | 4/1999 | Akram |
| 5,891,797 | A | 4/1999 | Farrar |
| 5,893,726 | A | 4/1999 | Farnworth et al. |
| 5,898,224 | A | 4/1999 | Akram |
| 5,933,713 | A | 8/1999 | Farnworth |
| 5,938,956 | A | 8/1999 | Hembree et al. |
| 5,946,553 | A | 8/1999 | Wood et al. |
| 5,956,236 | A | 9/1999 | Corisis et al. |
| 5,958,100 | A | 9/1999 | Farnworth et al. |
| 5,973,393 | A | 10/1999 | Chia et al. |
| 5,973,396 | A | 10/1999 | Farnworth |
| 5,986,209 | A | 11/1999 | Tandy |
| 5,989,941 | A | 11/1999 | Wensel |
| 5,990,566 | A | 11/1999 | Farnworth et al. |
| 5,994,784 | A | 11/1999 | Ahmad |
| RE36,469 | E | 12/1999 | Wood et al. |
| 6,008,070 | A | 12/1999 | Farnworth |
| 6,020,624 | A | 2/2000 | Wood et al. |
| 6,020,629 | A * | 2/2000 | Farnworth et al. .......... 257/686 |
| 6,025,728 | A | 2/2000 | Hembree et al. |
| 6,028,356 | A | 2/2000 | Kimura |
| 6,028,365 | A | 2/2000 | Akram et al. |
| 6,046,496 | A | 4/2000 | Corisis et al. |
| 6,048,744 | A | 4/2000 | Corisis et al. |
| 6,048,755 | A | 4/2000 | Jiang et al. |
| 6,049,125 | A | 4/2000 | Brooks et al. |
| 6,051,878 | A | 4/2000 | Akram et al. |
| 6,060,778 | A | 5/2000 | Jeong et al. |
| 6,066,514 | A | 5/2000 | King et al. |
| 6,072,233 | A | 6/2000 | Corisis et al. |
| 6,072,236 | A | 6/2000 | Akram et al. |
| 6,075,284 | A | 6/2000 | Choi et al. |
| 6,075,288 | A | 6/2000 | Akram |
| 6,089,920 | A | 7/2000 | Farnworth et al. |
| 6,093,969 | A * | 7/2000 | Lin ........................... 257/777 |
| 6,094,058 | A | 7/2000 | Hembree et al. |
| 6,097,087 | A | 8/2000 | Farnworth |
| 6,103,547 | A | 8/2000 | Corisis et al. |
| 6,107,122 | A | 8/2000 | Wood et al. |
| 6,107,680 | A | 8/2000 | Hodges |
| 6,117,382 | A | 9/2000 | Thummel |
| 6,117,710 | A | 9/2000 | Mostafazadeh et al. |
| 6,124,634 | A | 9/2000 | Akram et al. |
| 6,133,068 | A | 10/2000 | Kinsman |
| 6,137,162 | A | 10/2000 | Park et al. |
| 6,148,509 | A | 11/2000 | Schoenfeld et al. |
| 6,150,710 | A | 11/2000 | Corisis |
| 6,150,717 | A | 11/2000 | Wood et al. |
| 6,153,924 | A | 11/2000 | Kinsman |
| 6,159,764 | A | 12/2000 | Kinsman et al. |
| 6,172,419 | B1 | 1/2001 | Kinsman |
| 6,175,149 | B1 | 1/2001 | Akram |
| 6,184,465 | B1 | 2/2001 | Corisis |
| 6,198,172 | B1 | 3/2001 | King et al. |
| 6,208,020 | B1 | 3/2001 | Minamio et al. |
| 6,208,519 | B1 | 3/2001 | Jiang et al. |
| 6,210,992 | B1 | 4/2001 | Tandy et al. |
| 6,212,767 | B1 | 4/2001 | Tandy |
| 6,215,175 | B1 | 4/2001 | Kinsman |
| 6,215,177 | B1 | 4/2001 | Corisis et al. |
| 6,225,689 | B1 | 5/2001 | Moden et al. |
| 6,228,548 | B1 | 5/2001 | King et al. |
| 6,228,687 | B1 | 5/2001 | Akram et al. |
| 6,229,202 | B1 | 5/2001 | Corisis |
| 6,232,229 | B1 | 5/2001 | Reinberg |
| 6,235,554 | B1 | 5/2001 | Akram et al. |
| 6,246,108 | B1 | 6/2001 | Corisis et al. |
| 6,246,110 | B1 | 6/2001 | Kinsman et al. |
| 6,258,623 | B1 | 7/2001 | Moden et al. |
| 6,258,624 | B1 | 7/2001 | Corisis |
| 6,259,153 | B1 | 7/2001 | Corisis |
| 6,261,865 | B1 | 7/2001 | Akram |
| 6,265,660 | B1 | 7/2001 | Tandy |
| 6,277,671 | B1 | 8/2001 | Tripard |
| 6,277,704 | B1 | 8/2001 | Reinberg |
| 6,281,577 | B1 | 8/2001 | Oppermann et al. |
| 6,284,571 | B1 | 9/2001 | Corisis et al. |
| 6,291,894 | B1 | 9/2001 | Farnworth et al. |
| 6,294,839 | B1 | 9/2001 | Mess et al. |
| 6,297,543 | B1 | 10/2001 | Hong et al. |
| 6,303,469 | B1 | 10/2001 | Larson et al. |
| 6,303,981 | B1 | 10/2001 | Moden |
| 6,303,985 | B1 | 10/2001 | Larson et al. |
| 6,310,390 | B1 | 10/2001 | Moden |
| 6,314,639 | B1 | 11/2001 | Corisis |
| 6,316,285 | B1 | 11/2001 | Jiang et al. |
| 6,326,242 | B1 | 12/2001 | Brooks et al. |
| 6,326,244 | B1 | 12/2001 | Brooks et al. |
| 6,326,687 | B1 | 12/2001 | Corisis |
| 6,326,697 | B1 | 12/2001 | Farnworth |
| 6,326,698 | B1 | 12/2001 | Akram |
| 6,329,220 | B1 | 12/2001 | Bolken et al. |
| 6,329,705 | B1 | 12/2001 | Ahmad |
| 6,331,221 | B1 | 12/2001 | Cobbley |
| 6,331,448 | B1 | 12/2001 | Ahmad |
| 6,331,453 | B1 | 12/2001 | Bolken et al. |
| 6,332,766 | B1 | 12/2001 | Thummel |
| 6,337,510 | B1 | 1/2002 | Chun-Jen et al. |
| 6,339,254 | B1 | 1/2002 | Venkateshwaran et al. |
| 6,344,976 | B1 | 2/2002 | Schoenfeld et al. |
| 6,403,398 | B2 | 6/2002 | Ohuchi et al. |
| 6,429,528 | B1 | 8/2002 | King et al. |
| 6,486,545 | B1 * | 11/2002 | Glenn et al. ................ 257/686 |
| 6,498,393 | B2 | 12/2002 | Fujimoto et al. |
| 6,501,184 | B1 | 12/2002 | Shin et al. |
| 6,516,516 | B1 | 2/2003 | Lee |
| 6,518,659 | B1 | 2/2003 | Glenn |
| 6,576,494 | B1 | 6/2003 | Farnworth |
| 6,630,729 | B2 | 10/2003 | Huang |
| 6,819,003 | B2 | 11/2004 | Farnworth |
| 6,830,955 | B2 | 12/2004 | Shin et al. |
| 6,836,009 | B2 | 12/2004 | Koon et al. |
| 6,841,423 | B2 | 1/2005 | Farnworth |
| 2003/0042581 | A1 * | 3/2003 | Fee et al. ................... 257/666 |
| 2003/0164554 | A1 | 9/2003 | Fee et al. |
| 2005/0026325 | A1 | 2/2005 | Koon et al. |

OTHER PUBLICATIONS

Carson, John C., "Advances in Chip Level Packaging," Irvine Sensors Corporation, 36 pages, retrieved from the Internet on Jul. 17, 2003, <http://www.ece.jhu.edu/faculty/andreou/495/2002/LectureNotes/PackagingAdvancedpdf.pdf>.

Amkor Technology, MicroLeadFrame (MLF), 5 pages, retrieved from the Internet on Aug. 1, 2001, <http://www.amkor.com/Products/all_products/MLF.cfm>.

Amkor Technology, Application Notes for Surface Mount Assembly of Amkor's MicroLeadFrame (MLF) Packages, 14 pages, Mar. 2001.

Amkor Technology, Automotive/Thermal Enhanced Power Products, 16 pages, Aug. 2000.

Amkor Technology, RF Wireless Fact Sheet, 1 page, Feb. 2000.

Ishino, Toshiaki, Silicone Adhesive Tape, Nitto Technical Report, vol. 38, No. 2, pp. 49–50, Dec. 2000, <http://www.nitto.com/rd/2000_2/15ishinoe.qxp.pdf>.

Kuhnlein, Gerd, "A design and manufacturing solution for high reliable non–leaded CSP's like QFN," 2000 Electronics Packaging Technology Conference, IEEE, pp. 169–175.

Tech Connect, QFN Leadframes, ASM Pacific Technology Ltd., pp. 10–14.

Siliconware Precision Industries Ltd., TSOP 1 (Thin Small Outline Package type1), 2 pages, retrieved from the Internet on Jun. 26, 2003, <http://www.spil.com/tw/tsopi.html>.

Intersil, L56.8×8 56 Lead Quad Flat No–Lead Plastic Package, 1 page, Dec. 2002, <http://www.intersil.com/data/pk/L56.8×8.pdf>.

* cited by examinerns
PACKAGED MICROELECTRONIC COMPONENT ASSEMBLIES

CROSS-REFERENCE TO RELATED APPLICATION

This application claims foreign priority benefits of Singapore Application No. 200207050-6 filed Nov. 22, 2002, the entirety of which is incorporated herein by reference.

TECHNICAL FIELD

The present invention relates to packaged microelectronic components and methods for assembling the same. In particular, aspects of the invention relate to leaded microelectronic component packages and to stacked microelectronic component assemblies.

BACKGROUND

Semiconductor chips or dies are typically encapsulated in a package that protects the chips from the surrounding environment. The packages typically include leads or other connection points that allow the encapsulated chip to be electrically coupled to another microelectronic component. Leaded packages include a semiconductor chip bonded to a lead frame either seated on a die paddle or attached directly to the leads in a leads-over-chip attachment. The contact pads on the semiconductor die are then electrically connected to the chip, e.g., by wire bonding. The connected lead frame and chip may then be encapsulated in a mold compound to form a complete microelectronic component package. In most common applications, the leads extend out from the mold compound, allowing the chip to be electrically accessed. Typically, the leads extend laterally outwardly in a flat array that is part of a lead frame. This lead frame may be trimmed and formed into a desired configuration.

One increasingly popular technique for maximizing device density on a substrate is to stack microelectronic devices on top of one another. Stacking just one device on top of a lower device can effectively double the circuitry within a given footprint; stacking additional devices can further increase the circuit density.

In one approach, multiple microelectronic components are assembled in a single package. FIG. 1 schematically illustrates a thin small outline package (TSOP) 10 that includes an upper microelectronic component 20 and a lower microelectronic component 30. Such a TSOP 10 may be used in a memory module for a microelectronic device, for example. Typically, these microelectronic components 20 and 30 are semiconductor dies. Leads 42 of an upper lead frame 40 may be physically attached to the upper microelectronic component 20 via an adhesive, such as a conventional lead-on-chip tape 22. The inner lengths 44 of some or all of the leads 42 are electrically coupled to the upper microelectronic component 20 by individual wire bonds 24. Similarly, leads 52 of a lower lead frame 50 are physically attached to the lower microelectronic component 30 by an adhesive 32. Wire bonds 34 electrically connect the inner lengths 54 of selected leads 52 to the lower microelectronic component 30. The upper microelectronic component 20 and the lower microelectronic component 30 may be attached in a variety of ways, such as by a die attach adhesive 25.

The microelectronic components 20 and 30 and the inner lengths 44 and 54 of the leads 42 and 52, respectively, may be encapsulated in a mold compound 12. An outer length 46 of each lead 42 of the upper lead frame 40 extends outwardly beyond a periphery 14 of the mold compound 12. Similarly, an outer length 56 of each lead 52 of the lower lead frame 50 extends outwardly beyond the periphery 14 of the mold compound 12. The outer lengths 56 of the lower leads 52 may be shaped for connection to a substrate 60 or another microelectronic component. The TSOP 10 shown in FIG. 1 employs lower leads 52 with generally S-shaped outer lengths, which is commonplace for TSOPs; a wide variety of other shapes are known in the art for use in different applications.

The TSOP 10 shown in FIG. 1, and a number of like devices, has little or no good way to dissipate heat generated by the microelectronic components 20 and 30. Air may flow about the exterior of the mold compound 12. In addition, the exposed outer lengths 46 and 56 of the leads 42 and 52, respectively, can help conduct heat away from the microelectronic components 20 and 30 to the ambient environment of the TSOP 10. However, the microelectronic components 20 and 30 themselves are encapsulated in the mold compound 12 and have little direct thermal communication with the ambient atmosphere. This hampers the ability to cool the microelectronic components 20 and 30, increasing the likelihood of failure of the microelectronic components 20 and 30 over time.

The mold compound 12 of such a TSOP 10 often has a coefficient of thermal expansion (CTE) that differs from the CTE of the leads 42 and 52, wire bonds 24 and 34, and microelectronic components 20 and 30. The changes in temperature inherent in conventional manufacturing processes can warp or otherwise damage the microelectronic components 20 and 30 and/or adversely affect the electrical connections between the microelectronic components 20 and 30 and the lead frames 40 and 50, respectively. If either one of the microelectronic components 20 and 30 or their respective electrical connections is damaged, the entire TSOP 10 is considered defective. As a consequence, either an otherwise acceptable microelectronic component must be discarded with the defective microelectronic component or the microelectronic components 20 and 30 must be separated from one another to remove the defective component. For highly cost-competitive products, such as memory modules, both of these options may prove unduly expensive.

DETAILED DESCRIPTION

A. Overview

Figure 1:
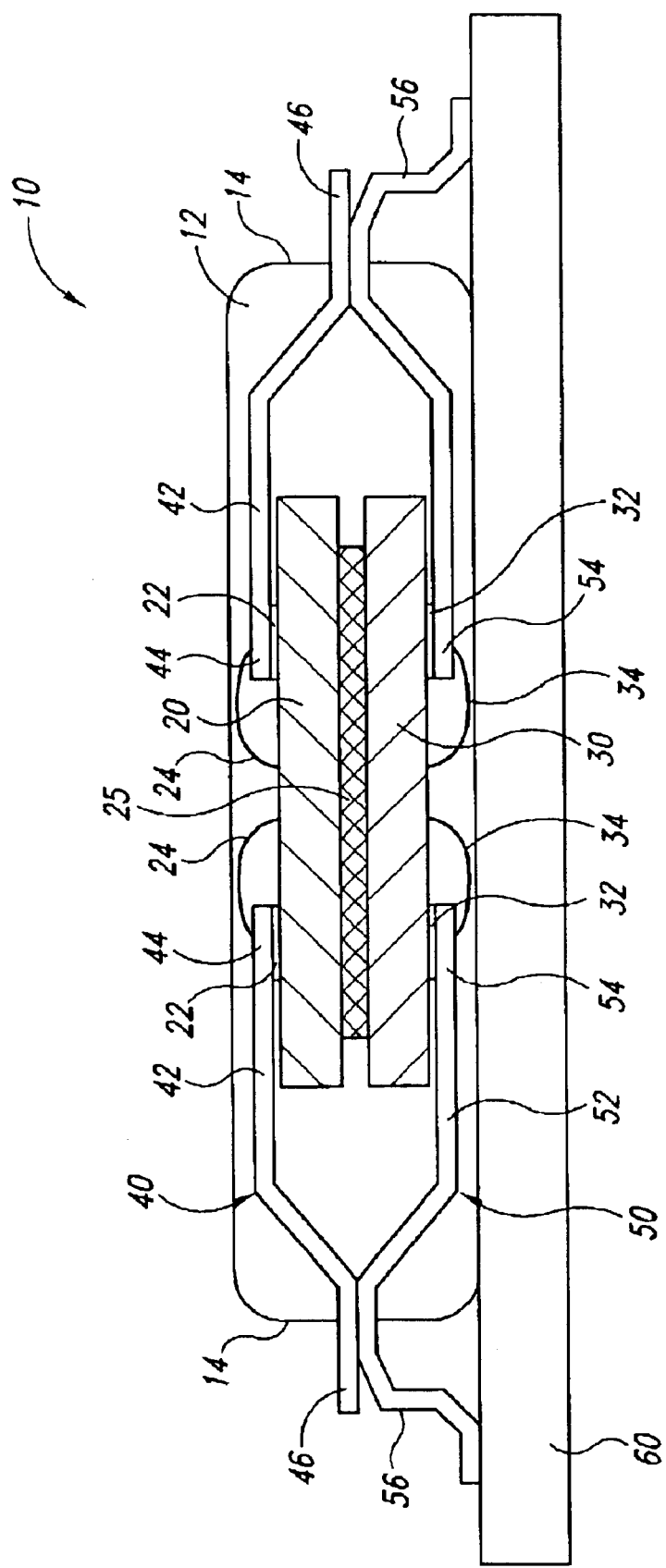
FIG. 1 is a schematic end view of a conventional TSOP microelectronic component package.

Various embodiments of the present invention provide microelectronic component assemblies, memory modules, computer systems, and methods for forming microelectronic component assemblies, memory modules, and computer systems. The terms "microelectronic component" and "microelectronic component assembly" may encompass a variety of articles of manufacture, including, e.g., SIMM, DRAM, flash-memory, ASICs, processors, flip chips, ball grid array (BGA) chips, or any of a variety of other types of microelectronic devices or components therefor.

One embodiment provides a microelectronic component assembly that includes first and second microelectronic component packages. The first package includes a first microelectronic component having a back surface and a first mold compound formed about the first microelectronic component, with the first mold compound also having a back surface. The first package also includes a plurality of first package contacts and a plurality of electrical connectors. Each of the first package contacts is exposed on the back surface of the first mold compound. At least some of the first package contacts are electrically coupled to the first microelectronic component. The electrical connectors are adapted for connection to another microelectronic component, e.g., a substrate such as a PCB. The electrical connectors are accessible from a location spaced from the back surface of the first mold compound. The second microelectronic component package of this embodiment includes a second microelectronic component having a back surface. A second mold compound formed about the second microelectronic component has a back surface. The back surfaces of the first and second mold compounds are juxtaposed with but spaced from one another to define a peripherally open interpackage gap. The back surface of the first microelectronic component and the back surface of the second microelectronic component are each thermally exposed to the interpackage gap. The second microelectronic component package also includes a plurality of second package contacts electrically coupled to the second microelectronic component. Each second package contact is exposed on the back surface of the second mold compound, and at least one of the second package contacts is electrically coupled to at least one of the first package contacts.

One further embodiment of the invention incorporates such a microelectronic component assembly in a memory module. The memory module also includes a module board configured to be electrically coupled with a higher level microelectronic device. Another adaptation employs such a memory module in a computer system that may also include an input device, an output device, and a processor that is in communication with the input device, the output device, and the memory module.

A microelectronic component assembly in accordance with an alternative embodiment of the invention includes a non-leaded first package, a second package, and a plurality of electrical junctions. The first package includes a first microelectronic die, a dielectric first mold compound, a plurality of contacts, and a first confronting surface. The first confronting surface includes a back surface of the first mold compound, an exposed back surface of the first microelectronic die, and exposed surfaces of the contacts. The second package includes a second microelectronic die, a dielectric second mold compound having a periphery, and a plurality of leads having outer lengths extending outwardly beyond the periphery of the second mold compound and adapted for electrical connection to another microelectronic component. The second package also has a second confronting surface that includes a back surface of the second mold compound, an exposed back surface of the second microelectronic die, and exposed contact surfaces of the leads arranged within the periphery of the second mold compound. Each of the electrical junctions electrically couples one of the contacts to the exposed contact surface of one of the leads. The electrical junctions also physically support the first package with respect to the second package, with the first and second confronting surfaces juxtaposed with but spaced from one another to define a fluid passage between the back surface of the first microelectronic die and the back surface of the second microelectronic die.

Still another embodiment of the invention provides a method of assembling a microelectronic component assembly. In accordance with this method, a first confronting surface of a first microelectronic component package is juxtaposed with a second confronting surface of a second microelectronic component package. So juxtaposing the packages aligns an array of exposed first contacts on the first confronting surface with a mating array of exposed second contacts on the second confronting surface. This also juxtaposes an exposed back surface of a first microelectronic component included in the first microelectronic component package with an exposed back surface of a second microelectronic component included in the second microelectronic component package. The first package is electrically coupled to the second package with a plurality of electrical junctions. Each electrical junction electrically couples one of the first contacts to one of the second contacts. The electrical junctions also support the first package with respect to the second package, with the first confronting surface spaced from the second confronting surface to define a peripherally open air gap therebetween.

For ease of understanding, the following discussion is subdivided into three areas of emphasis. The first section discusses certain microelectronic component assemblies; the second section relates to computer systems in select embodiments; and the third section outlines methods in accordance with other embodiments of the invention.

B. Microelectronic Component Assemblies

Figure 2:
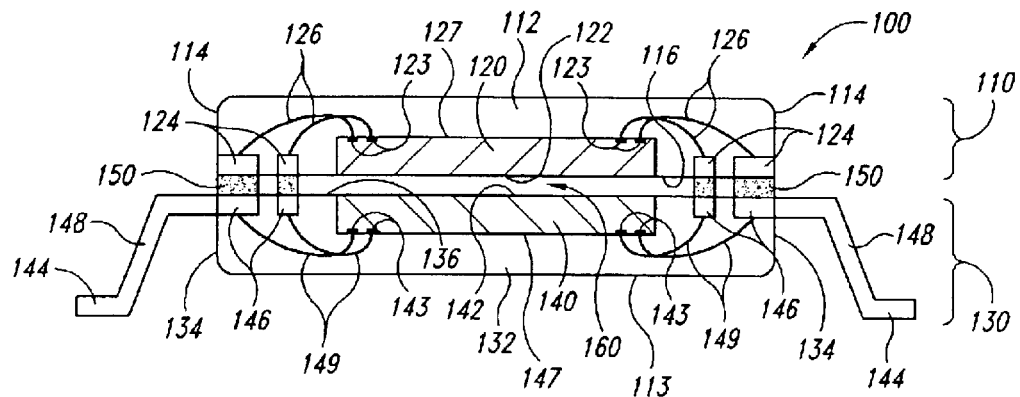
FIG. 2 is a schematic end view of a microelectronic component assembly in accordance with one embodiment of the invention.

FIG. 2 schematically illustrates a microelectronic component assembly 100 in accordance with one embodiment of the invention. The microelectronic component assembly 100 includes a first microelectronic component package 110 and a second microelectronic component package 130. In the orientation shown in FIG. 2, the first microelectronic component package 110 is positioned above the second microelectronic component package 130. Although the first microelectronic component package 110 may be referred to below as the "upper" package and the second microelectronic component 130 may be referred to below as the "lower" package, this is solely for purposes of convenience; the microelectronic component assembly 100 can be oriented in any direction desired.

The first microelectronic component package 110 includes a mold compound 112 formed about a first microelectronic component 120. The mold compound 112 may comprise a curable dielectric resin, e.g., a silicon particle-filled polymer, suitable for forming under heat and pressure by transfer molding and the like. A wide variety of suitable resins are well known in the art and commercially available from a number of sources.

Figure 3:
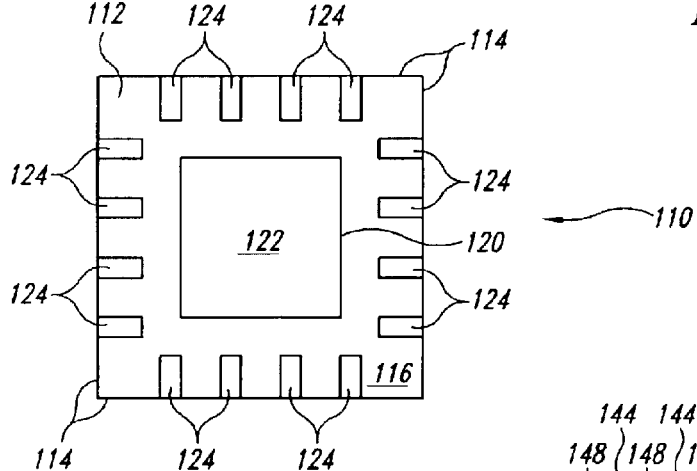
FIG. 3 is a schematic bottom view of the upper microelectronic component in FIG. 2.

In the illustrated embodiment, the mold compound 112 surrounds five of the six sides of the centrally positioned microelectronic component 120. As shown in FIGS. 2 and 3, the mold compound 112 may extend peripherally outwardly of the microelectronic component 120. The mold compound 112 has a periphery, which may be square, rectangular, or any other suitable shape, that is spaced outwardly from the microelectronic component 120.

The first package 110 has a confronting surface 116. The confronting surface 116 may be substantially planar and include a back surface of the mold compound 112 and a back surface 122 of the microelectronic component 120. In the embodiment shown in FIG. 2, the back surface 122 of the microelectronic component 120 is flush with the back surface of the mold compound 112, yielding a generally planar confronting surface 116 of the first package 110.

Figures 7, 8:
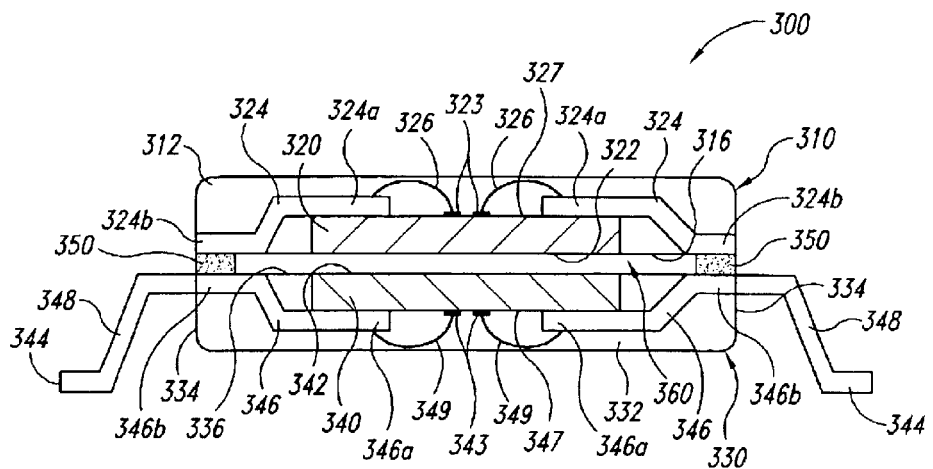
FIG. 7 is a schematic end view of a microelectronic component assembly in accordance with still another embodiment of the invention.
FIG. 8 is a schematic block diagram of a computer system in accordance with a further embodiment of the invention.

The first microelectronic component 120 may comprise a single microelectronic component or a subassembly of separate microelectronic components. In the embodiment shown in FIGS. 2 and 3, the microelectronic component 120 is typified as a semiconductor die. In one particular embodiment, the microelectronic component 120 comprises a memory element, e.g., SIMM, DRAM, or flash memory. The first microelectronic component 120 may include a plurality of component terminals 123 on an active surface 127 of the microelectronic component 120. The component terminals 123 may be arranged on the active surface 127 in an array, which may be a generally peripheral array, as shown, a linear array (as illustrated in FIG. 7), or any other suitable array.

The first package 110 also includes a plurality of contacts 124. These contacts 124 may be exposed in an array on the confronting surface 116 of the first package 110. The contacts 124 of the first package 110 may be carried adjacent a periphery of the mold compound 112. In one embodiment (not shown), the contacts 124 comprise leads that extend outwardly beyond the periphery of the mold compound 112. In the embodiment shown in FIGS. 2 and 3, however, the first microelectronic component package 110 is a non-leaded package in which the contacts 124 do not extend appreciably outwardly beyond the periphery 114.

In the specific implementation shown in FIGS. 2 and 3, the contacts 124 are arranged in a peripheral row in which each of the contacts 124 is located at the periphery 114 of the mold compound 112. The peripheral row of contacts 124 may extend along each side of the first microelectronic component package 110 in the interest of increasing the number of contacts for a given package size. Some designs, however, might not require such an arrangement.

Figure 3A:
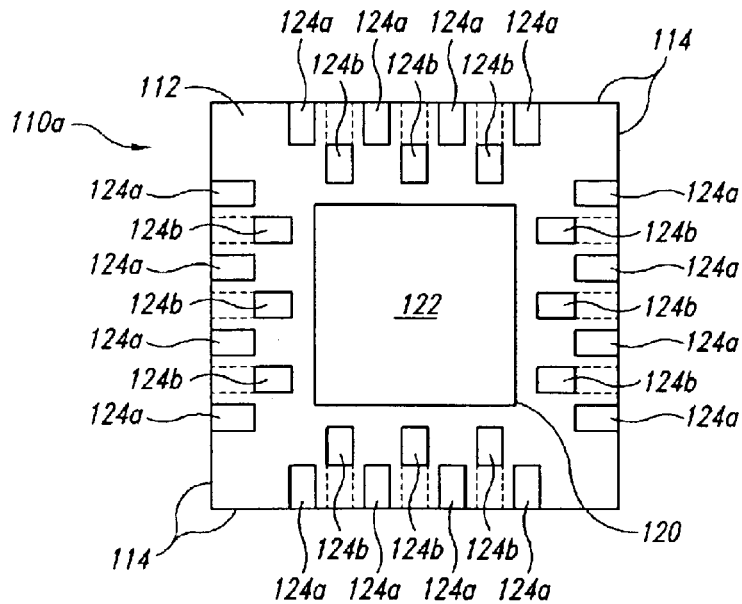
FIG. 3A is a schematic bottom view, similar to FIG. 3, of an upper microelectronic component in accordance with an alternative embodiment.

FIG. 3A illustrates a first microelectronic component package 110A in accordance with an alternative embodiment. This alternative first package 110A is similar in many respects to the first package 110 shown in FIG. 3. Hence, the first package 110A includes a microelectronic component 120 having an exposed back surface 122. In this embodiment, though, the contacts 124A and 124B are arranged in a staggered array instead of the peripheral row illustrated in FIG. 3. In FIG. 3A, a first set of contacts 124A is arranged in a peripheral row, similar to the peripheral row of contacts 124 in FIG. 3. The alternative first package 110A includes a second set of contacts 124B, each of which has an exposed surface spaced inwardly from the periphery 114 of mold compound 112. These contacts 124B may have an additional length (shown in dashed lines), which may extend from the exposed contact surface to the periphery 114, that is encapsulated in the mold compound 112. This will yield a staggered array of contacts 124A–B on the back surface (116 of FIG. 2) of the package 110A. The alternative first package 110A may be formed in any desired fashion. One suitable method is described in U.S. patent application Ser. No. 09/944,246 filed 30 Aug. 2001 and entitled "Packaged Microelectronic Devices and Methods of Forming Same", the entirety of which is incorporated herein by reference.

At least some of the contacts 124 are electrically coupled to component terminals 123 of the first microelectronic component 120. This may be accomplished using conventional methods, e.g., by connecting the component terminals 123 and contacts 124 with wire bonds 126.

The second microelectronic component package 130 includes a mold compound 132 that is formed about and partially encapsulates a second microelectronic component 140. The mold compound 132 has a periphery that is spaced from the periphery of the centrally disposed second microelectronic component 140. A back surface of the mold compound 132 may also define a portion of the confronting surface 136 of the second microelectronic component package 130.

The second microelectronic component 140 may be the same kind of microelectronic component as the first microelectronic component 120, or the first and second microelectronic components 120 and 140 may comprise different types of components having different functions. In one embodiment, both the first microelectronic component 120 and the second microelectronic component 140 comprise memory elements, e.g., SIMM, DRAM, or flash memory. In such an embodiment, the microelectronic component assembly 100 may be used in a memory module of a computer system, as explained below.

The second microelectronic component package 130 includes a plurality of leads 144. Each of these leads has an inner length with an exposed surface defining a contact 146 on the confronting surface 136 of the package 130. The leads 144 also serve as electrical connectors adapted for connection to another microelectronic component, e.g., a PCB or other substrate (60 in FIG. 1). Hence, each lead 144 extends outwardly from the contact 146 beyond the periphery 134 of the mold compound 132. The outer length 148 of each of the leads 144 may be bent into any desired shape for connection to another microelectronic component. In the embodiment shown in FIGS. 2 and 4, the outer lengths 148 of the leads 144 are generally S-shaped in a fashion similar to conventional TSOPs or thin quad flat package (TQFP). Other embodiments may employ other conventional lead shapes, e.g., SOJ leads or DIP leads.

Figure 4:
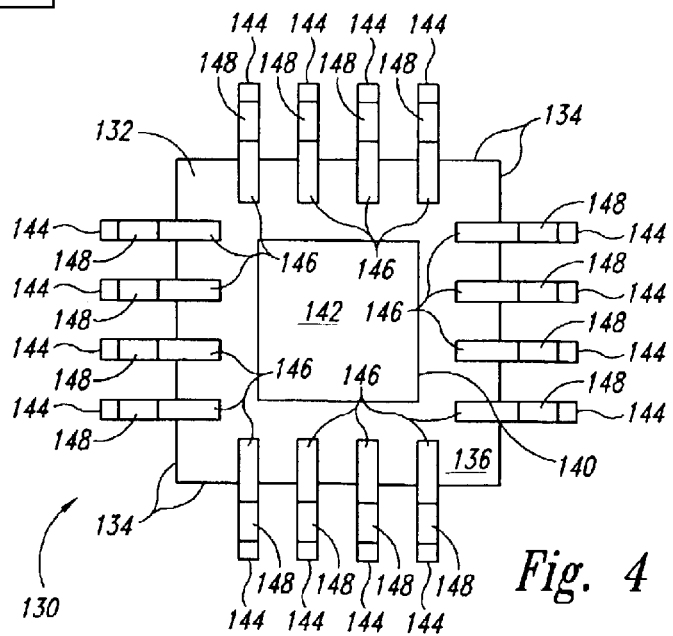
FIG. 4 is a schematic top view of the lower microelectronic component in FIG. 2.
Figure 4A:
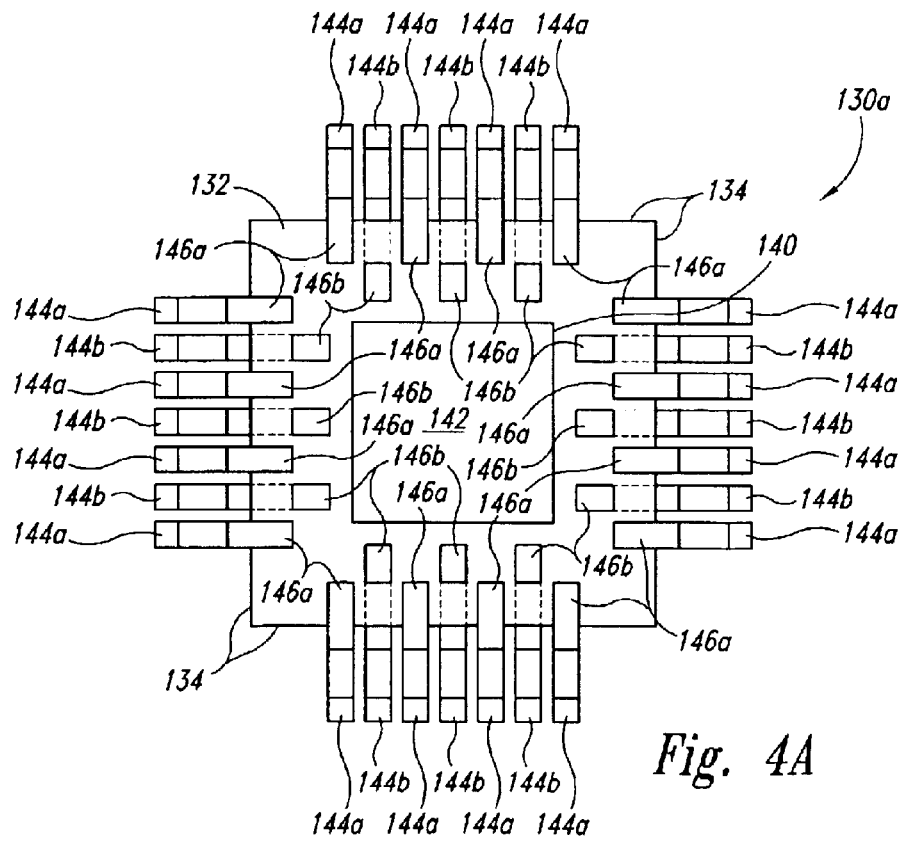
FIG. 4A is a schematic top view, similar to FIG. 4, of a lower microelectronic component in accordance with an alternative embodiment.

In FIG. 4, all of the contacts 146 are arranged in a peripheral row. FIG. 4A illustrates a second microelectronic component package 130A in which the contacts 146A and 146B are arranged in a staggered array. In this embodiment, a first set of contacts 146A is arranged in a peripheral row, similar to the contacts 146 in FIG. 4. A second set of contacts 146B are spaced inwardly from the periphery 134 of the old compound 132. In the specific embodiment shown in FIG.

4A, each of the first contacts 146A comprises an inner length of a first lead 144A that has an exposed surface along its entire length. Each of the second contacts 146B may comprise an exposed inner length of a second lead 144B. An intermediate length (shown in dashed lines in FIG. 4A) of each of the second leads 144B may be entirely encapsulated in the mold compound 132, leaving a gap between each of the exposed second contacts 146B and the periphery 134 of the mold compound 132. This alternative second package 130A may be formed in a fashion directly analogous to that employed in forming the alternative first package 110A in FIG. 3A, e.g., using the processes outlined in U.S. patent application Ser. No. 09/944,246, which is incorporated herein by reference.

The illustrated embodiment employs exposed outer lead lengths 148 to electrically connect the package 130 to another microelectronic component (not shown), but the package 130 need not include such exposed outer lengths. Any other electrical connector accessible from a location spaced from the confronting surface 136 may be used instead. For example, an array of contacts may be carried on a front surface 113 of the mold compound 112, as suggested by Farnworth et al. in U.S. Pat. No. 6,020,629, the entirety of which is incorporated herein by reference.

The second microelectronic component 140 includes a plurality of component terminals 143 arranged in an array, e.g., a peripheral array, on an active surface 147. One or more of the leads 144 may be electrically coupled to a component terminal 143 of the second microelectronic component 140, such as via the wire bonds 149 shown in FIG. 2.

The second microelectronic component 140 has a back surface 142 that defines part of the confronting surface 136 of the second package 130. In the embodiment shown in FIGS. 2 and 4, the back surface 142 of the second microelectronic component 140 is substantially coplanar with the back surface of the mold compound 132 and the exposed surfaces of the contacts 146. This yields a substantially planar confronting surface 136.

The first microelectronic component package 110 is electrically coupled to the second microelectronic component package 130. In particular, one or more of the contacts 124 of the first microelectronic component package 110 may be electrically coupled to the contacts 146 of the second microelectronic component package 130 by an electrical junction 150. In one particular embodiment, each of the first package contacts 124 is electrically coupled to one of the second package contacts 146 by a single electrically independent electrical junction 150. In this particular embodiment, the second package contacts 146 are arranged in an array that mates with the array of first package contacts 124.

In one embodiment, the electrical junctions 150 not only electrically couple the first package contacts 124 to the second package contacts 146, but also physically support the first microelectronic component package 110 with respect to the second microelectronic component package 130. The electrical junctions 150 may take a variety of forms. For example, the electrical junctions 150 may comprise a reflowed solder. (One process for forming such a reflowed solder junction 150 is discussed below.) Such solder junctions are well known in the art. Alternatives to a reflowed solder include conductive or conductive-filled epoxy columns or pillars, spheres (either conductive or insulative) covered with a conductive material, and anisotropic "Z-axis" films. Other suitable junctions will be known to those of ordinary skill in the art.

The confronting surface 116 of the first microelectronic component package 110 may be juxtaposed with but spaced from the confronting surface 136 of the second microelectronic component package 130. These two confronting surfaces 116 and 136 may be spaced from one another a distance equivalent to the height of the electrical junctions 150. These spaced-apart confronting surfaces 116 and 136 define an interpackage gap between the first microelectronic component package 110 and the second microelectronic component package 130. In the illustrated embodiment, the back surface 122 of the first microelectronic component 120 is juxtaposed with the back surface 142 of the second microelectronic component 140 across this interpackage gap 160. This thermally exposes the back surfaces 122 and 142 to the interpackage gap 160.

This interpackage gap 160 defines a fluid passage between the two confronting surfaces 116 and 136. In one embodiment, the interpackage gap 160 is filled with air and is peripherally open. This defines openings between the electrical junctions 150 through which air may flow. For example, the electrical junctions 150 may be spaced from one another about the peripheries 114 and 134 of the first package 110 and second package 130, respectively. Allowing air to flow through the interpackage gap 160 can help cool the microelectronic components 120 and 140. Exposing the first component back surface 122 and the second component back surface 142 directly to the interpackage gap 160 allows heat to dissipate rapidly from the components 120 and 140. This can significantly reduce the risk of overheating encountered in a conventional stacked TSOP 10 such as that shown in FIG. 1.

Figure 5:
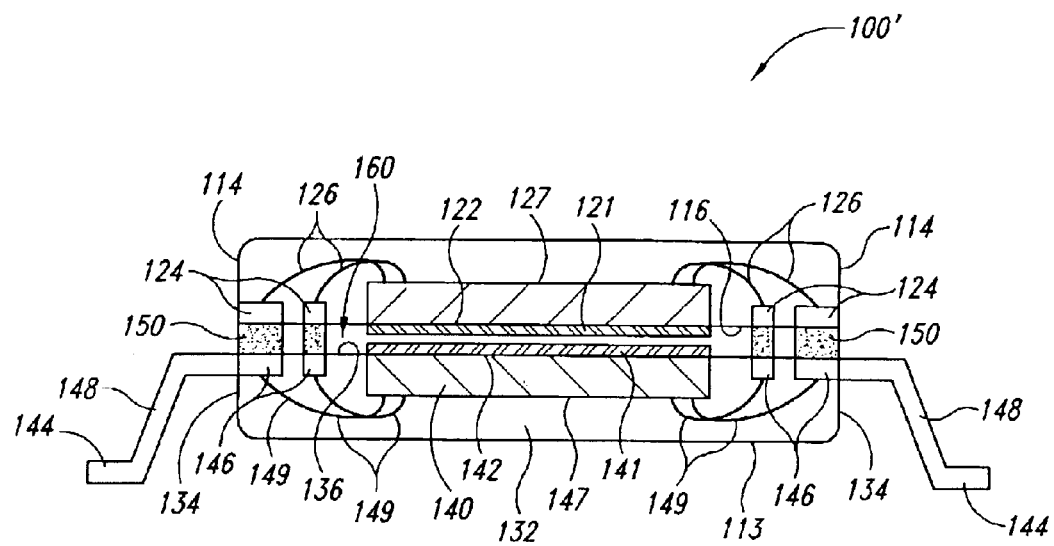
FIG. 5 is a schematic end view of a microelectronic component assembly in accordance with an alternative embodiment of the invention.

The back surfaces 122 and 142 of the microelectronic components 120 and 140, respectively, need not be directly physically exposed to the interpackage gap 160. For example, FIG. 5 schematically illustrates a microelectronic component assembly 100' in accordance with another embodiment of the invention. Most of the elements of the assembly 100' are the same as those of the assembly 100 in FIGS. 2–4 and bear the same reference numbers. The assembly 100' in FIG. 5, however, includes a first heat sink 121 attached to the first component back surface 122 and a second heat sink 141 attached to the second component back surface 142. Each of these heat sinks 121 and 141 may comprise a thermally conductive material suitable for bonding to the microelectronic component 120 or 140, respectively. For example, if the microelectronic components 120 and 140 are semiconductor dies, the heat sinks 121 and 141 may comprise thin sheets of metal. Although the component back surfaces 122 and 142 are not directly exposed to the interpackage gap 160, they are thermally exposed to the interpackage gap 160 via the thermally conductive heat sinks 121 and 141.

In one embodiment, the back surface of each heat sink 121 and 141 exposed to the interpackage gap 160 may be substantially flush with the back surface of the mold compound 112, providing the packages 110 and 130 with substantially planar confronting faces 116 and 136, respectively. In the illustrated embodiment, though, the first heat sink 121 extends into the interpackage gap 160 beyond the back surface of the first mold compound 112 and the second heat sink 141 extends into the interpackage gap 160 beyond the back surface of the second mold compound 132.

Figure 6:
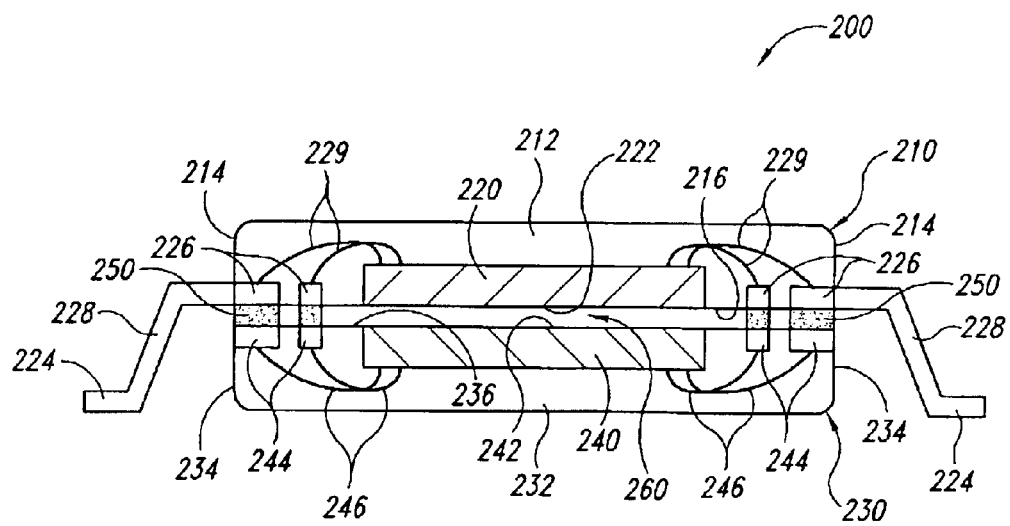
FIG. 6 is a schematic end view of a microelectronic component in accordance with another embodiment of the invention.

FIG. 6 illustrates a microelectronic component assembly 200 in accordance with an alternative embodiment of the invention. The embodiment of FIG. 2 employs a non-leaded microelectronic component package 110 on a leaded microelectronic component package 130. The microelectronic component assembly 200 of FIG. 6 is similar in many respects to the microelectronic component assembly 100 of FIG. 2, but in FIG. 6 the "upper" package 210 is a leaded package and the "lower" package 230 is a non-leaded package.

The first microelectronic component package 210 in FIG. 6 includes a first microelectronic component 220 that is partially encapsulated in a mold compound 212, leaving at least a portion of the back surface 222 of the first microelectronic component 220 exposed on the confronting surface 216 of the first package 210. At least some of the leads 224 of the first package 210 may be electrically coupled to the first microelectronic component 220 by wire bonds 229. An outer length 228 of each of the leads extends outwardly from the periphery 214 of the mold compound 212.

The second microelectronic component package 230 in FIG. 6 includes a second microelectronic component 240 partially encapsulated in a second mold compound 232. The back surface 242 of the second microelectronic component 240 defines a portion of the confronting surface 236 of the second microelectronic component package 230. The second package 230 includes a plurality of contacts 244 arranged in an array on the confronting surface 236. Some or all of the contacts 244 may be electrically coupled to the second microelectronic component 240 by wire bonds 246. In the illustrated embodiment, none of these contacts 244 extends beyond the periphery 234 of the second mold compound 232.

The first package contacts 226 are electrically coupled to the second package contacts 244 by a plurality of electrical junctions 250. As in the prior embodiments, these electrical junctions may comprise reflowed solder junctions or any other suitable electrical junction known in the art. These electrical junctions 250 also physically join the first and second microelectronic component packages 210 and 230 with their confronting surfaces 216 and 236, respectively, juxtaposed with but spaced from one another. This defines an interpackage gap 260, which can facilitate cooling of the microelectronic components 220 and 240 via their thermally exposed back surfaces 222 and 242, respectively.

FIG. 7 illustrates a microelectronic component assembly 300 in accordance with another alternative embodiment. This microelectronic component assembly 300 includes a non-leaded first microelectronic component package 310 and a leaded second microelectronic component package 330. The first package 310 includes a first microelectronic component 320 that is partially encapsulated in a mold compound 312. A back surface 322 of the first microelectronic component 320 and a back surface of the mold compound 312 define a confronting surface 316 of the first package 310. A plurality of component terminals 323 (only two being shown in FIG. 7) may be arranged in a linear array on an active surface 327 of the microelectronic component 320.

The first microelectronic component package 310 also includes a plurality of conductive elements 324 having an inner portion 324a and a contact portion 324b. The inner portion 324a of each conductive element 324 may be physically attached to the active surface 327 of the first microelectronic component 320 in any desired fashion, e.g., using a conventional lead-on-chip adhesive tape (not shown). The inner portions 324a of some or all of the conductive elements 324 may be electrically coupled to the component terminals 323 by wire bonds 326. A back surface of each of the contact portions 324b may be exposed on the confronting surface 316 of the package 310. In the illustrated embodiment, the exposed surfaces of the contact portions 324b are generally aligned with the back surface of the mold compound 312 and the microelectronic component back surface 322, yielding a substantially planar first package confronting surface 316.

The second microelectronic component package 330 includes a second microelectronic component 340 that is partially encapsulated in a second mold compound 332, leaving a back surface 342 exposed. A plurality of component terminals 343 may be arranged on the active surface 347 of the second microelectronic component 340, e.g., in a longitudinally extending linear array.

The second microelectronic component package 330 also includes a plurality of conductive elements 344. Each of these conductive elements 344 has an inner length 346 that is partially encapsulated in the mold compound 332 and an outer length 348 that extends outward beyond the periphery 334 of the mold compound 332. An inner portion 346a of the inner length 346 of some or all of the conductive elements 344 may be electrically coupled to one of the component terminals 343 of the second microelectronic component 340 by a wire bond 349 or the like. The inner length 346 of each of the second package conductive elements 344 includes a contact portion 346b having an exposed back surface. The exposed back surfaces of the contact portions 346b, a back surface of the mold compound 332, and the back surface 342 of the microelectronic component 340 collectively define a confronting surface 336 of the second microelectronic component package 330.

The second microelectronic component package 130 of the microelectronic component assembly 100 in FIGS. 2–4 includes leads 144 extending outwardly from each peripheral side. Although it is not apparent in the end view of FIG. 7, the second microelectronic component package 330 of the microelectronic component assembly 300 has conductive elements 344 (which may be functionally analogous to the leads 144 of FIGS. 2 and 4) extending laterally outwardly from only two opposite sides of the second package 330 in a manner analogous to a conventional TSOP or DIP.

Each of the first package contact portions 324b may be electrically coupled to one of the second package contact portions 346b by an electrical junction 350.

The electrical junction 350 may be formed of the same materials and in much the same fashion as the electrical junction 150 discussed above in connection with FIGS. 2–4. This defines an interpackage gap 360 between the confronting surfaces 316 and 336. Having electrical junctions 350 extending only along two opposite sides of the microelectronic component assembly 300 leaves the other two ends of the interpackage gap 360 without electrical junctions 350 that may impede air flow through the interpackage gap 360. This improved air flow may further enhance cooling of the microelectronic components 320 and 340.

C. Computer Systems

FIG. 8 is a schematic block diagram of a computer system 500 in accordance with another embodiment of the invention. This computer system 500 includes an input device 510 (such as a keyboard and/or a mouse) and an output device 520 (e.g., a display or printer interface). The input device 510 and output device 520 may be in electrical communication with a processor 530. The processor 530, which may comprise a programmable processor, is also in electrical communication (e.g., through traces of a motherboard) with one or more memory modules 540 incorporating one or more microelectronic component assemblies 100, 100', 200, 300, or variations thereof. The memory module 540 may also include a substrate 542 to which the microelectronic component assembly or assemblies (e.g., microelectronic component assembly 100) is or are, respectively, attached. This substrate 542 may, for example, comprise a memory board having an electrical circuit formed therein, such as a PCB.

D. Methods

As noted above, other embodiments of the invention provide methods of assembling microelectronic component assemblies. In the following discussion, reference is made to the particular microelectronic component assembly 100 shown in FIG. 2. It should be understood, though, that the reference to this particular microelectronic component assembly 100 is solely for purposes of illustration and that the method outlined below is not limited to any particular microelectronic component assembly design shown in the drawings or discussed in detail above.

Figure 11:
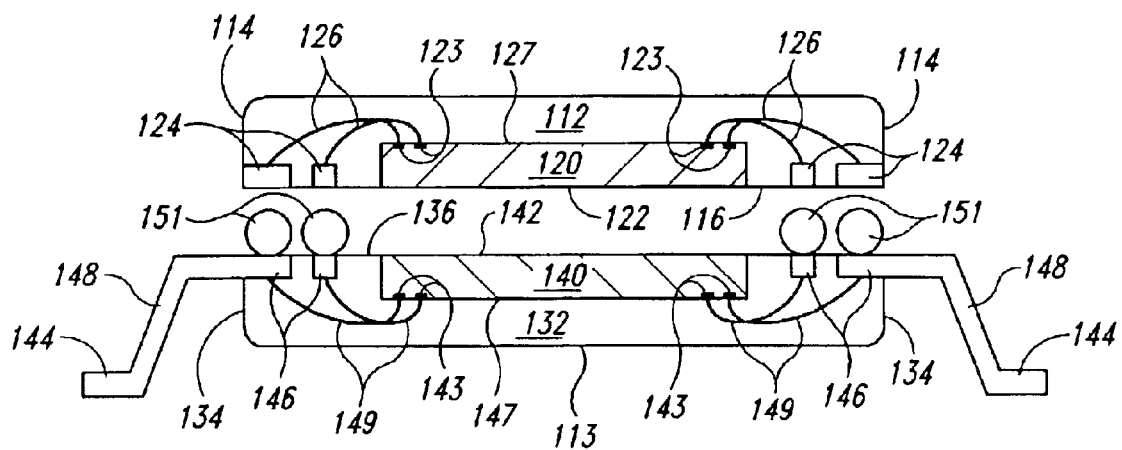
FIG. 11 is a cross-sectional view schematically illustrating a stage in the manufacture of a microelectronic component assembly in accordance with a further embodiment of the invention.

In one embodiment, the confronting surface 116 of the first microelectronic component package 110 is juxtaposed with the confronting surface 136 of the second microelectronic component package 130. As shown in FIG. 11, the packages 110 and 130 may be juxtaposed such that the array of contacts 124 on the first package confronting surface 116 is aligned with the array of contacts 146 on the second package confronting surface 136. This will also juxtapose the back surface 122 of the first microelectronic component 120 with the back surface 142 of the second microelectronic component 140.

The juxtaposed microelectronic component packages 110 and 130 may be electrically coupled to one another. In the microelectronic component assembly 100 of FIG. 2, these packages 110 and 130 are electrically coupled by a plurality of electrical junctions 150. Each of these spaced-apart electrical junctions may electrically couple one of the first package contacts 124 to a corresponding second package contact 146.

The electrical junctions 150 may be formed using any of a variety of conventional processes. In one embodiment, a solder paste is stenciled on the exposed surface of each of the first contacts 124. In another embodiment, the solder paste may be stenciled instead on the exposed surfaces of the second package contacts 146. As is known in the art, heating the stenciled solder paste causes the solder to coalesce into a solder ball, providing an array of solder balls 151 (FIG. 11) corresponding to the array of contacts 124 (or 146). When the microelectronic component packages 110 and 130 are juxtaposed, the solder balls 151 may be brought into direct physical contact with the exposed surface of the corresponding second package contact 146. These solder balls 151 may temporarily physically support the first microelectronic component package 110 with respect to the second microelectronic component package 130. This subassembly may then be heated to reflow the solder balls 151 to form the electrical junctions 150. When cooled, these electrical junctions 150 will also physically attach the packages 110 and 130 to one another with their juxtaposed confronting surfaces 116 and 136, respectively, spaced from one another to define the interpackage gap 160. If an epoxy or other material is used for the electrical junctions 150, these junctions may be formed following the instructions provided by the epoxy manufacturer.

Figure 9:
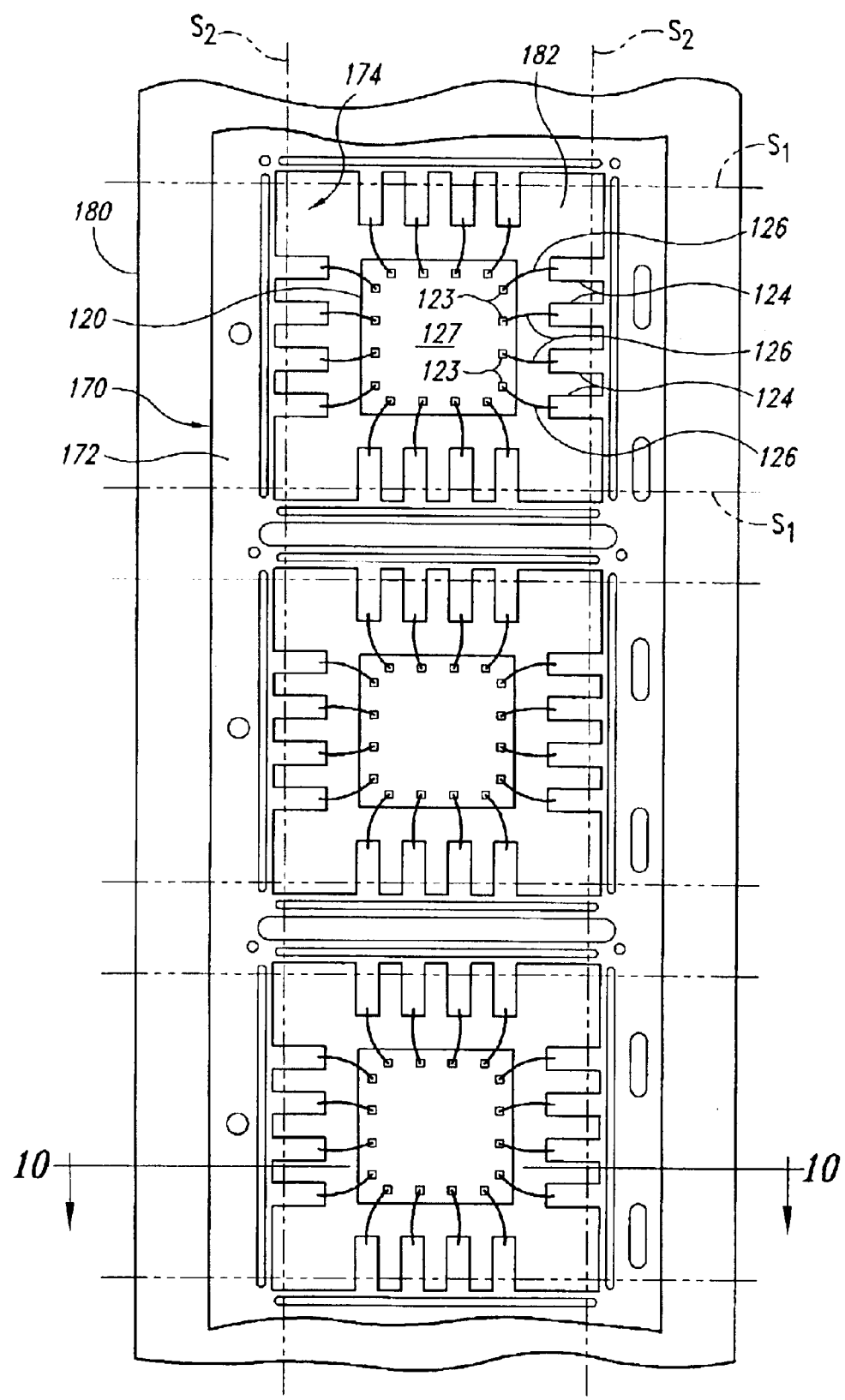
FIG. 9 schematically illustrates one stage in the manufacture of a microelectronic component in accordance with one method of the invention.
Figure 10:
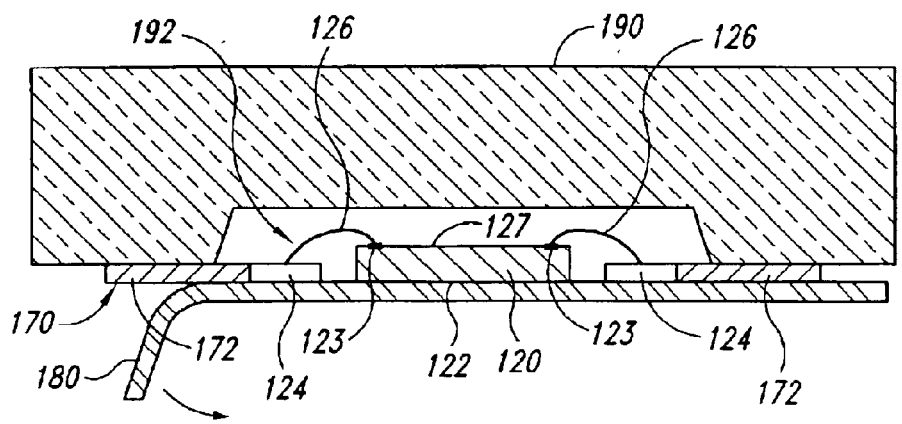
FIG. 10 is a cross-sectional view schematically illustrating a subsequent stage in the manufacture of the same microelectronic component.

As noted above, the contacts 124 of the first microelectronic component package 110 are exposed on and form a part of the first package confronting surface 116. Similarly, the inner length of the leads 144 may be exposed on the confronting surface 136 of the second microelectronic component package 130 to define the second package contacts 146. This may be accomplished in a variety of ways. FIGS. 9 and 10 schematically illustrate aspects of one suitable process for manufacturing the first microelectronic component package 110; an analogous process may be used to manufacture the second microelectronic component package 130.

FIG. 9 illustrates a plurality of microelectronic components 120 electrically coupled to a lead frame 170. The lead frame 170 may include a plurality of openings 174, each of which is bound by a peripheral dam bar 172. A number of lead fingers, each of which corresponds to one of the contacts 124, may extend inwardly from the dam bar 172. The lead frame 170 is fairly conventional in this respect.

The lead frame 170 may be attached to a backing member 180. The backing member 180 spans the width of each opening 174 in the lead frame 170, leaving an exposed surface 182 of the backing member 180 in each opening 174. In one embodiment, the backing member 180 comprises an adhesive tape that can adhesively hold the lead frame 170.

Each of the microelectronic components 120 may be positioned in one of the openings 174 in the lead frame. The back surface (122 in FIG. 2) of the microelectronic component 120 may be attached to the exposed surface 182 of the backing member 180. One or more of the component terminals 123 on the microelectronic component active surface 127 may be electrically coupled to one or more of the contacts 124 by wire bonds 126, yielding the structure shown in FIG. 9.

As suggested in FIG. 10, a mold element 190 may be positioned adjacent the dam bar 172 of the lead frame 170 on the side opposite the backing member 180. The mold element 190, the lead frame 170, and the backing member 180 thus define a mold cavity 192 that extends above the lead frame 170 and the microelectronic component 120. Using conventional transfer molding techniques, this cavity 192 may be filled with a dielectric resin or the like that can partially encapsulate the microelectronic component 120 and the contacts 124 and substantially completely encapsulate the wire bonds 126. The back surface 122 of the microelectronic component 120 and the back surface of the lead frame 170 are attached to the backing member 180, preferably in a generally fluid-tight seal to substantially enclose the cavity 192. The mold compound that fills the cavity 192 will have a back surface that is in contact with the backing member 180 and is disposed between the periphery of the microelectronic component 120 and the opening 174 in the lead frame 170.

FIG. 9 illustrates a stage in a transfer molding operation in one embodiment. It should be noted that the mold compound (112 in FIGS. 2 and 3) need not be formed via transfer molding, though. In other embodiments, the mold compound 112 may be deposited using capillary-based liquid dispensing, glob top, or other conventional techniques.

Once the dielectric resin has been appropriately cured, the backing member 180 may be removed. If the backing member 180 comprises an adhesive tape, for example, it may be peeled away from the lead frame 170 and microelectronic component 120, as shown schematically by the arrow in FIG. 10. Removing the backing member 180 exposes the back surface of each contact 124, the back surface 122 of the microelectronic component 120, and a back surface of the mold compound (not shown in FIG. 10).

The lead frame 170 may be trimmed by cutting away the peripheral dam bar 172 adjacent each opening 174. As shown schematically in FIG. 9, the lead frame 170 may be cut along a pair of generally parallel longitudinal saw cuts $S_2$ and a series of generally parallel transverse saw cuts $S_1$ to yield the microelectronic component package 110 of FIG. 2.

The saw cuts $S_1$ and $S_2$ may follow along or be spaced inwardly from the inner surface of the peripheral dam bar 172. The saw cuts $S_1$ and $S_2$ may also cut through the mold compound (112 in FIGS. 2 and 3), defining the periphery of the microelectronic component package 110. This will sever each of the contacts 124 from the rest of the lead frame 170, leaving the contacts 124 extending inwardly from the periphery 114 of the mold compound 112, as shown in FIGS. 2 and 3. If so desired, the mold compound 112 may be spaced inwardly from the dam bar 172 and the saw cuts $S_1$ and $S_2$ can be disposed between the mold compound and the dam bar 172. When the lead frame is cut, a short length (e.g., 0.1 mm) of the contacts 124 may extend outwardly beyond the periphery 114 of the mold compound 112.

Unless the context clearly requires otherwise, throughout the description and the claims, the words "comprise," "comprising," and the like are to be construed in an inclusive sense as opposed to an exclusive or exhaustive sense, that is to say, in a sense of "including, but not limited to." Words using the singular or plural number also include the plural or singular number, respectively. When the claims use the word "or" in reference to a list of two or more items, that word covers all of the following interpretations of the word: any of the items in the list, all of the items in the list, and any combination of the items in the list.

The above-detailed descriptions of embodiments of the invention are not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, whereas steps are presented in a given order, alternative embodiments may perform steps in a different order. The various embodiments described herein can be combined to provide further embodiments.

In general, the terms used in the following claims should not be construed to limit the invention to the specific embodiments disclosed in the specification, unless the above-detailed description explicitly defines such terms. While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A microelectronic component assembly comprising:
    a first microelectronic component package comprising:
        a first microelectronic component having a back surface;
        a first mold compound formed about the first microelectronic component, the first mold compound having a back surface;
        a plurality of first package contacts, each of which is exposed on the back surface of the first mold compound, at least some of the first package contacts being electrically coupled to the first microelectronic component; and
        a plurality of electrical connectors adapted for connection to another microelectronic component, the electrical connectors being accessible from a location spaced from the back surface of the first mold compound; and
    a second microelectronic component package comprising:
        a second microelectronic component having a back surface;
        a second mold compound formed about the second microelectronic component, the second mold compound having a back surface, the back surfaces of the first and second mold compounds being juxtaposed with but spaced from one another to define a peripherally open interpackage gap, the back surface of the first microelectronic component and the back surface of the second microelectronic component each being thermally exposed to the interpackage gap; and
        a plurality of second package contacts electrically coupled to the second microelectronic component, each second package contact being exposed on the back surface of the second mold compound and at least one of the second package contacts being electrically coupled to at least one of the first package contacts.

2. The microelectronic component assembly of claim 1 wherein the second microelectronic component package is a non-leaded package.

3. The microelectronic component assembly of claim 1 wherein the interpackage gap comprises an air-filled gap between the first confronting surface and the second confronting surface.

4. The microelectronic component assembly of claim 1 wherein the back surface of the first microelectronic component is exposed directly to the interpackage gap.

5. The microelectronic component assembly of claim 1 wherein the back surface of the second microelectronic component is exposed directly to the interpackage gap.

6. The microelectronic component assembly of claim 1 wherein the back surface of the first microelectronic component and the back surface of the second microelectronic component are each exposed directly to the interpackage gap and juxtaposed with one another across the interpackage gap.

7. The microelectronic component assembly of claim 1 further comprising a heat sink thermally coupled to the back surface of the first microelectronic component, the heat sink being exposed to the interpackage gap.

8. The microelectronic component assembly of claim 1 further comprising a heat sink thermally coupled to the back surface of the second microelectronic component, the heat sink being exposed to the interpackage gap.

9. The microelectronic component assembly of claim 1 further comprising a first heat sink thermally coupled to the back surface of the first microelectronic component and a second heat sink thermally coupled to the back surface of the second microelectronic component, the first and second heat sinks being exposed to the interpackage gap and juxtaposed with one another across the interpackage gap.

10. The microelectronic component assembly of claim 1 further comprising a heat sink thermally coupled to the back surface of the first microelectronic component, the heat sink extending into the interpackage gap beyond the back surface of the first mold compound.

11. The microelectronic component assembly of claim 1 wherein each of the electrical connectors comprises a length of a lead extending outwardly from the mold compound.

12. The microelectronic component assembly of claim 1 wherein the first package contacts are carried adjacent a periphery of the first mold compound.

13. The microelectronic component assembly of claim 1 wherein the first package contacts are carried adjacent a periphery of the first mold compound and the second package contacts are carried adjacent a periphery of the second mold compound.

14. The microelectronic component assembly of claim 1 wherein each of the first package contacts comprises an exposed surface of a lead and an exposed length of each of the leads defines one of the electrical connectors.

15. A microelectronic component assembly comprising:
a non-leaded first package including a first microelectronic die, a dielectric first mold compound, and a plurality of contacts, the first package having a first confronting surface including a back surface of the first mold compound, an exposed back surface of the first microelectronic die, and exposed surfaces of the contacts;
a second package including a second microelectronic die, a dielectric second mold compound having a periphery, and a plurality of leads having outer lengths extending outwardly beyond the periphery of the second mold compound and adapted for electrical connection to another microelectronic component, the second package having a second confronting surface including a back surface of the second mold compound, an exposed back surface of the second microelectronic die, and exposed contact surfaces of the leads arranged within the periphery of the second mold compound; and
a plurality of electrical junctions, each of the electrical junctions electrically coupling one of the contacts to the contact surface of one of the leads and physically supporting the first package with respect to the second package with the first and second confronting surfaces juxtaposed with but spaced from one another to define a fluid passage between the back surface of the first microelectronic die and the back surface of the second microelectronic die.

16. The microelectronic component assembly of claim 15 wherein the fluid passage is peripherally open to facilitate cooling of the first and second microelectronic dies.

17. The microelectronic component assembly of claim 15 wherein the fluid passage comprises an air-filled gap between the first confronting surface and the second confronting surface.

18. The microelectronic component assembly of claim 15 wherein the back surface of the first microelectronic die is exposed directly to fluid in the fluid passage.

19. The microelectronic component assembly of claim 15 wherein the back surface of the second microelectronic die is exposed directly to fluid in the fluid passage.

20. The microelectronic component assembly of claim 15 wherein the back surface of the first microelectronic die and the back surface of the second microelectronic die are each exposed directly to fluid in the fluid passage and juxtaposed with one another across the fluid passage.

21. The microelectronic component assembly of claim 15 further comprising a heat sink thermally coupled to the back surface of the first microelectronic die, the heat sink being exposed to fluid in the fluid passage.

22. The microelectronic component assembly of claim 15 further comprising a heat sink thermally coupled to the back surface of the second microelectronic die, the heat sink being exposed to fluid in the fluid passage.

23. The microelectronic component assembly of claim 15 further comprising a first heat sink thermally coupled to the back surface of the first microelectronic die and a second heat sink thermally coupled to the back surface of the second microelectronic die, the first and second heat sinks being exposed to fluid in the fluid passage and juxtaposed with one another across the fluid passage.

24. The microelectronic component assembly of claim 15 further comprising a heat sink thermally coupled to the back surface of the first microelectronic die, the heat sink extending into the fluid passage beyond the back surface of the first mold compound.

25. The microelectronic component assembly of claim 15 wherein the exposed surfaces of the first leads are carried adjacent a periphery of the first mold compound and the second package contacts are carried adjacent a periphery of the second mold compound.

26. The microelectronic component assembly of claim 15 wherein the first confronting surface is parallel to the second confronting surface.

27. The microelectronic component assembly of claim 15 wherein each of the electrical junctions comprises a reflowed solder.

28. A memory module comprising:
a module board configured to be electrically coupled with a higher-level microelectronic device;
a first microelectronic component package comprising:
a first microelectronic component having a back surface;
a first mold compound formed about the first microelectronic component, the first mold compound having a back surface;
a plurality of first package contacts, each of which is exposed on the back surface of the first mold compound, at least some of the first package contacts being electrically coupled to the first microelectronic component; and
a plurality of electrical connectors adapted for connection to another microelectronic component, the electrical connectors being accessible from a location spaced from the back surface of the first mold compound; and
a second microelectronic component package comprising:
a second microelectronic component having a back surface;
a second mold compound formed about the second microelectronic component, the second mold compound having a back surface, the back surfaces of the first and second mold compounds being juxtaposed with but spaced from one another to define a peripherally open interpackage gap, the back surface of the first microelectronic component and the back surface of the second microelectronic component each being thermally exposed to the interpackage gap; and
a plurality of second package contacts electrically coupled to the second microelectronic component, each second package contact being exposed on the back surface of the second mold compound and at least one of the second package contacts being electrically coupled to at least one of the first package contacts.

29. The memory module of claim 28 wherein the first microelectronic component package is a non-leaded package.

30. The memory module of claim 28 wherein the back surface of the first microelectronic component and the back surface of the second microelectronic component are each exposed directly to the interpackage gap and juxtaposed with one another across the interpackage gap.

31. The memory module of claim 28 further comprising a first heat sink thermally coupled to the back surface of the first microelectronic component and a second heat sink thermally coupled to the back surface of the second microelectronic component, the first and second heat sinks being exposed to the interpackage gap and juxtaposed with one another across the interpackage gap.

32. The memory module of claim 28 further comprising a heat sink thermally coupled to the back surface of the first microelectronic component, the heat sink extending into the interpackage gap beyond the back surface of the first mold compound.

33. The memory module of claim 28 wherein the first package contacts are carried in an array adjacent a periphery of the first mold compound and the second package contacts are carried in a mating array adjacent a periphery of the second mold compound.

34. The memory module of claim 28 wherein each of the first package contacts comprises an exposed surface of a lead and an exposed length of each of the leads defines one of the electrical connectors.

35. A computer system comprising:
   an input device;
   an output device;
   a processor in communication with the input device and the output device; and
   a memory module in communication with the processor, the memory module comprising:
      a module board configured to be electrically coupled with a higher-level microelectronic device;
      a first microelectronic component package comprising:
         a first microelectronic component having a back surface;
         a first mold compound formed about the first microelectronic component, the first mold compound having a back surface;
         a plurality of first package contacts, each of which is exposed on the back surface of the first mold compound, at least some of the first package contacts being electrically coupled to the first microelectronic component; and
         a plurality of electrical connectors adapted for connection to another microelectronic component, the electrical connectors being accessible from a location spaced from the back surface of the first mold compound; and
      a second microelectronic component package comprising:
         a second microelectronic component having a back surface;
         a second mold compound formed about the second microelectronic component, the second mold compound having a back surface, the back surfaces of the first and second mold compounds being juxtaposed with but spaced from one another to define a peripherally open interpackage gap, the back surface of the first microelectronic component and the back surface of the second microelectronic component each being thermally exposed to the interpackage gap; and
         a plurality of second package contacts electrically coupled to the second microelectronic component, each second package contact being exposed on the back surface of the second mold compound and at least one of the second package contacts being electrically coupled to at least one of the first package contacts.

36. A method of assembling a microelectronic component assembly, comprising:
   juxtaposing a first confronting surface of a first microelectronic component package with a second confronting surface of a second microelectronic component package and, in so doing, aligning an array of exposed first contacts on the first confronting surface with a mating array of exposed second contacts on the second confronting surface and juxtaposing an exposed back surface of a first microelectronic component included in the first microelectronic component package with an exposed back surface of a second microelectronic component included in the second microelectronic component package; and
   electrically coupling the first microelectronic component package to the second microelectronic component package with a plurality of electrical junctions, each electrical junction electrically coupling one of the first contacts to one of the second contacts, the electrical junctions supporting the first microelectronic component package with respect to the second microelectronic component package with the first confronting surface spaced from the second confronting surface to define a peripherally open air gap therebetween.

37. The method of claim 36 wherein the electrical junctions are arranged in an open array permitting air to flow into the air gap.

* * * * *